(12) United States Patent
DeGraaff

(10) Patent No.: US 8,963,375 B2
(45) Date of Patent: Feb. 24, 2015

(54) DEVICE AND METHOD FOR ELECTRICALLY DECOUPLING A SOLAR MODULE FROM A SOLAR SYSTEM

(75) Inventor: David DeGraaff, Mountain View, CA (US)

(73) Assignee: SunPower Corporation, San Jose, CA (US)

(*) Notice: Subject to any disclaimer, the term of this patent is extended or adjusted under 35 U.S.C. 154(b) by 896 days.

(21) Appl. No.: 13/174,495

(22) Filed: Jun. 30, 2011

(65) Prior Publication Data

US 2013/0002335 A1    Jan. 3, 2013

(51) Int. Cl.
| | |
|---|---|
| H02J 1/00 | (2006.01) |
| H02J 3/00 | (2006.01) |
| H01H 35/00 | (2006.01) |
| H01L 31/02 | (2006.01) |

(52) U.S. Cl.
CPC ........... *H01L 31/02021* (2013.01); *Y02E 10/50* (2013.01)
USPC ............... 307/85; 307/86; 307/128; 307/130; 327/419

(58) Field of Classification Search
None
See application file for complete search history.

(56) References Cited

U.S. PATENT DOCUMENTS

| | | | |
|---|---|---|---|
| 2011/0240100 A1* | 10/2011 | Lu et al. | 136/251 |
| 2011/0276192 A1* | 11/2011 | Ropp | 700/293 |
| 2012/0091808 A1* | 4/2012 | Paull | 307/51 |
| 2012/0199172 A1* | 8/2012 | Avrutsky | 136/244 |

FOREIGN PATENT DOCUMENTS

| | | |
|---|---|---|
| DE | 10136147 A1 | 2/2003 |
| DE | 102004059100 A1 | 6/2006 |
| WO | WO 03/071655 A1 | 8/2003 |
| WO | WO 2008/077473 A2 | 7/2008 |

OTHER PUBLICATIONS

Philippe Welter, et al. "Electricity at 32 kHz," Photon International, The Photovoltaic Magazine—Archive, Aug. 2007, p. 110 (http://www.photon-magazine.com/archiv/article.aspx?criteria=4&HeftNr=0807&Titel=Ele . . . printed May 27, 2011).

Sang-Hoey Lee, et al. "Mitigation of Low Frequency AC Ripple in Single-Phase Photovoltaic Power Conditioning Systems," Journal of Power Electronics, vol. 10, No. 3, May 2010, pp. 328-333.

* cited by examiner

*Primary Examiner* — Jared Fureman
*Assistant Examiner* — Aqeel Bukhari
(74) *Attorney, Agent, or Firm* — Blakely Sokoloff Taylor & Zafman LLP

(57) ABSTRACT

Devices and methods for electrically decoupling a solar module from a solar system are described. In one embodiment, a solar system includes a string of a plurality of solar modules coupled with an inverter through a DC power line. An AC input is coupled with the DC power line. A device is also included and is configured to provide a closed circuit for one of the plurality of solar modules if an AC signal voltage from the AC input is present on the DC power line, and is configured to provide an open circuit for the one of the plurality of solar modules if no AC signal voltage from the AC input is present on the DC power line.

12 Claims, 4 Drawing Sheets

DEVICE AND METHOD FOR ELECTRICALLY DECOUPLING A SOLAR MODULE FROM A SOLAR SYSTEM

TECHNICAL FIELD

Embodiments of the present invention are in the field of renewable energy and, in particular, devices and methods for electrically decoupling a solar module from a solar system.

BACKGROUND

Photovoltaic (PV) cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto. A plurality of photovoltaic cells may be included in a solar module. A string of several to many solar modules may make up a solar system.

A challenge with PV systems mounted on roofs is that a PV system is a power source which may not have the ability to be turned off in the case of a fire. Such a situation may increase the hazard of fighting a fire on a residence which has a PV system. If each module can be turned off when the main power to the house is turned off by the fire fighters, then any electrical hazard may be greatly reduced. Specifically, the electrical hazard may be reduced to only the output of an individual module. However, challenges arise in providing a system with a reduced electrical hazard in a way that does not add significant cost to the PV system, and does not reduce the reliability of the PV system. Approaches attempted thus far are expensive and may have a negative impact on system reliability.

DETAILED DESCRIPTION

Devices and methods for electrically decoupling a solar module from a solar system are described herein. In the following description, numerous specific details are set forth, such as specific open circuit and closed circuit configurations, in order to provide a thorough understanding of embodiments of the present invention. It will be apparent to one skilled in the art that embodiments of the present invention may be practiced without these specific details. In other instances, well-known fabrication techniques, such as solar panel or solar module fabrication techniques, are not described in detail in order to not unnecessarily obscure embodiments of the present invention. Furthermore, it is to be understood that the various embodiments shown in the figures are illustrative representations and are not necessarily drawn to scale.

Systems disclosed herein may be configured to turn off one or more modules of a PV system when an AC power line is shut-off. In an embodiment, a low voltage AC signal is provided onto the DC PV lines of a PV system. In one embodiment, the source of the AC signal is the house power. Accordingly, the AC signal goes away if the house power is tripped to OFF. In a specific embodiment, a PV system includes a low-cost and low-power transformer. Each module has a low-cost device which keeps the system connected as long as the AC signal is present. If the AC signal goes away, then each module is independently disconnected. The actual system used to disconnect each module should be very robust and low cost. In one embodiment, a power transistor or a thermal switch (which is "closed" when hot) is used.

As such, disclosed herein are solar systems with devices for electrically decoupling a solar module from a solar system. In an embodiment, a solar system includes a string of a plurality of solar modules coupled with an inverter through a DC power line. An AC input is coupled with the DC power line. A device is also included and is configured to provide a closed circuit for one of the plurality of solar modules if an AC signal voltage from the AC input is present on the DC power line, and is configured to provide an open circuit for the one of the plurality of solar modules if no AC signal voltage from the AC input is present on the DC power line.

Also disclosed herein are methods of electrically decoupling a solar module from a solar system. In an embodiment a method includes providing an AC signal from an energy grid to a solar system to provide a closed circuit for a solar module of the solar system. The AC signal is cut from the solar system, providing an open circuit for the solar module.

Figure 1A:
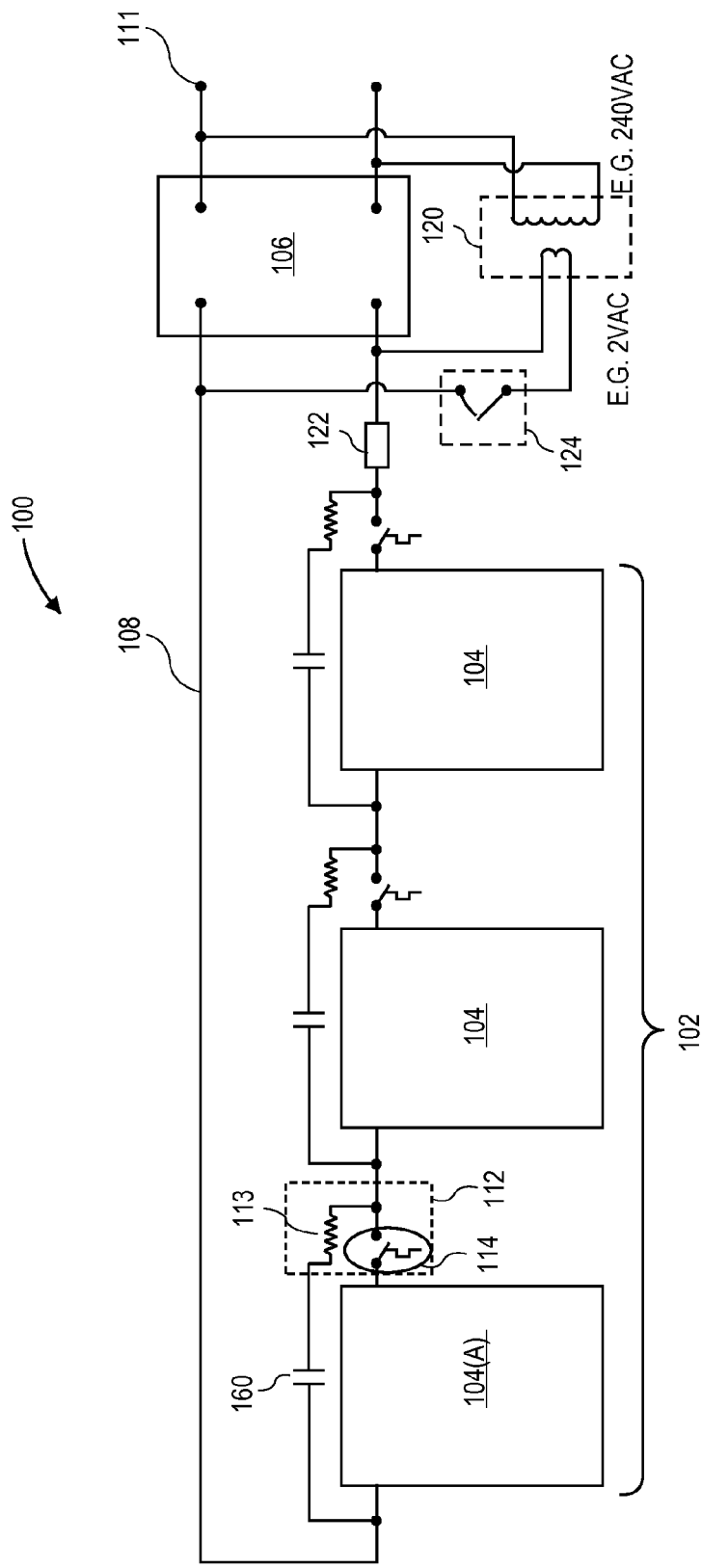
FIG. 1A illustrates a schematic diagram of a solar system having a device for electrically decoupling a solar module from the solar system, in accordance with an embodiment of the present invention.

FIG. 1A illustrates a schematic diagram of a solar system having a device for electrically decoupling a solar module from the solar system, in accordance with an embodiment of the present invention.

Referring to FIG. 1A, a solar system 100 includes a string 102 of a plurality of solar modules 104 coupled with an inverter 106 through a DC power line 108. An AC source 111, such as a grid, is coupled with the DC power line 108 via a transformer 120 and an AC input 110. A device 112 is configured to provide a closed circuit for one of the plurality of solar modules 104 (e.g., for solar module 104A) if a signal is received at the AC input 110. On the other hand, the device 112 is configured to provide an open circuit for the one of the plurality of solar modules 104 (e.g., for solar module 104A) if no signal is received at the AC input 110.

Thus, in an embodiment, solar system 100 is configured to turn off one or more solar modules 104 when an AC power line is shut-off. In one such embodiment, when the AC signal goes away, each module 104 is independently disconnected. For example, in a specific embodiment, each of the plurality of solar modules 104 includes a device 112 configured to provide a closed circuit for each of the plurality of solar modules 104, respectively, if a signal is received at the AC input 110, and configured to provide an open circuit for each of the plurality of solar modules 104, respectively, if no signal is received at the AC input 110. In an embodiment, as described above, the AC input 110 is coupled with a residential main power supply, e.g., a grid. In one such embodiment, the device 112 is configured to provide an open circuit for the one of the plurality of solar modules 104 in response to a fire, overheating, or other emergency event during which the residential main power supply is powered OFF.

The AC input 110 may be any suitable source of an AC signal, the presence of which may be readily detectable at the solar system 100. In an embodiment, the AC input 110 is sourced from the transformer 120 operating from an approximately 240 VAC house power line 111 connected to a power grid, as depicted in FIG. 1. In another embodiment, the AC input 110 is sourced from the transformer 120 operating from an approximately 120 VAC house power line connected to a power grid.

In an embodiment, the actual system used to disconnect each module is very robust and low cost. In one such embodiment, the device 112 includes a thermal switch 114 coupled in series with the one of the plurality of solar modules 104, as depicted in FIG. 1A. The thermal switch may be configured to be closed if a signal is received at the AC input 110, and may be configured to be open if no signal is received at the AC input 110. In one embodiment, the thermal switch 114 is closed when the AC signal current 110 is providing current to a resistor 113 and rendering the switch thermally "hot." In an alternative embodiment (not shown in FIG. 1A, but described below in association with FIG. 1C), the device configured to provide a closed or open circuit depending on a received AC signal includes a power transistor.

In an embodiment, the solar system 100 also includes the transformer 120, as depicted in FIG. 1A. The transformer 120 may couple the AC source 111 and the DC power line 108. In a specific embodiment, the transformer 120 steps down an approximately 240 VAC to approximately 2 VAC, as is also depicted in FIG. 1A. However, any suitable step-down factor that provides a detectable, yet non-interfering, AC signal into the DC power line 108 may be used. The solar system 100 may also include a fuse 122. Furthermore, a PV panel ON/OFF switch 124 may also be included. Both a fuse 122 and a PV panel ON/OFF switch 124 are depicted in FIG. 1A.

Figure 1B:
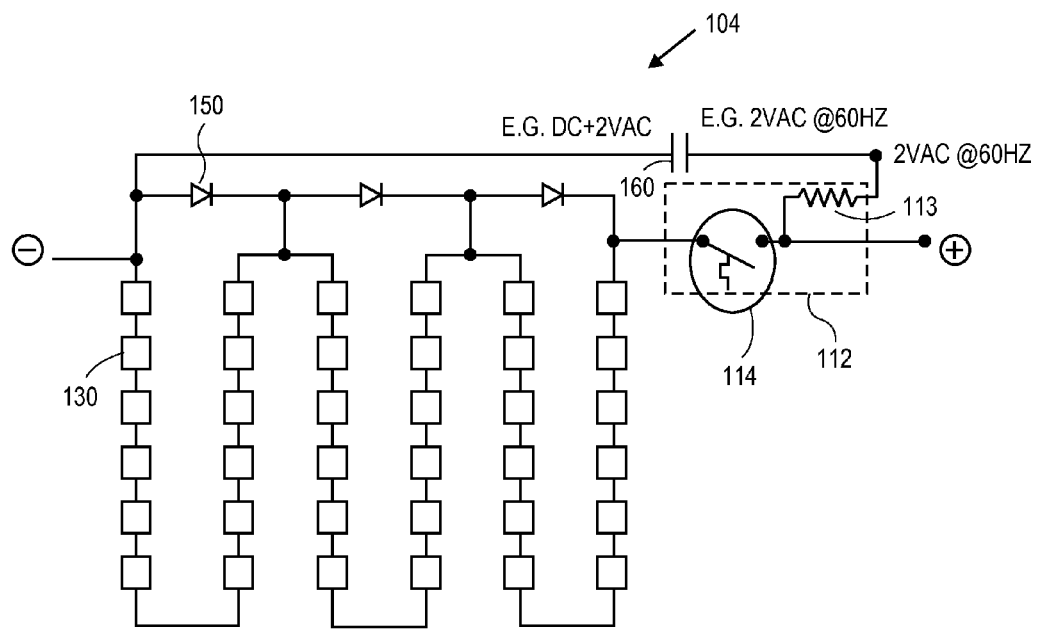
FIG. 1B illustrates a schematic diagram of a single solar module having a device for electrically decoupling the solar module from a solar system, in accordance with an embodiment of the present invention.

For a more detailed view, FIG. 1B illustrates a schematic diagram of a single solar module having a device for electrically decoupling the solar module from a solar system, in accordance with an embodiment of the present invention.

Referring to FIG. 1B, a solar module 104 includes one or more solar cells 130 configured to provide a DC signal to a solar system. A device 112 is configured to provide a closed circuit for the solar module 104 in response to a received AC signal, and is configured to provide an open circuit for the solar module 104 if no AC signal is received. As described above, and as is also depicted in FIG. 1B, in one embodiment, the device 112 includes a thermal switch 114 coupled in series with the solar cells 130. The thermal switch 114 is configured to be closed if an AC signal is received. On the other hand, the thermal switch 114 is configured to be open if no AC signal is received. In an embodiment, the thermal switch 114 includes a resistive heater, such as resistor 113, to maintain the thermal switch 114 at a temperature above a selected threshold temperature. For example, in a specific embodiment, the thermal switch 114 includes a ¼ W resistive heater to maintain the thermal switch 114 at a temperature above approximately 150 degrees Celsius. The thermal switch 114 is closed in the presence of an input AC signal, e.g., when 2 VAC is ON. However, in the absence of an input AC signal, e.g., when 2 VAC is OFF, the thermal switch 114 is open.

The thermal switch 114 may also be referred to as a temperature switch, a temperature-actuated switch, or a bimetallic and low resistance thermal switch. In an embodiment, the thermal switch 114 includes a thin strip of two metals joined back to back (e.g., a bimetallic strip). Each metal has a different rate of thermal expansion. When the strip heats or cools, differing rates of thermal expansion between the two metals cause the strip to bend. The bending of the strip may be used to actuate a switch contact mechanism. In another embodiment, the thermal switch 114 includes a brass bulb filled with either liquid or gas, with a small tube connecting the bulb to a pressure-sensing switch. As the bulb is heated, the gas or liquid expands, generating a pressure increase which then actuates the switch mechanism.

Figure 1C:
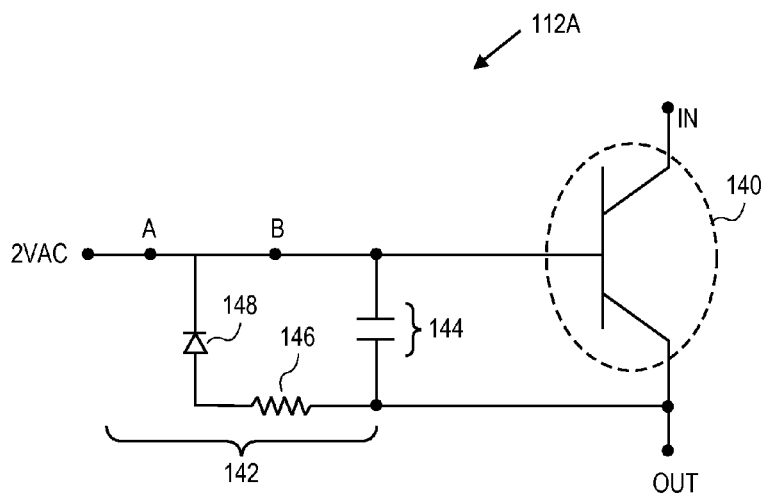
FIG. 1C illustrates a schematic diagram of a power transistor for electrically decoupling a solar module from a solar system, in accordance with an embodiment of the present invention.

In place of the shown device 112 of FIGS. 1A and 1B, in an alternative embodiment, a power transistor is used. For example, FIG. 1C illustrates a schematic diagram of a power transistor for electrically decoupling a solar module from a solar system, in accordance with an embodiment of the present invention. Referring to FIG. 1C, a device 112A includes a power transistor 140. A half-wave rectifier 142 from A to B is also included with a reservoir capacitor 144, a resistor 146, and a diode 148. In an embodiment, the half-wave rectifier 142 provides a gate voltage suitable to turn the transistor 1400N when the AC signal from AC input 110 is present. In one such embodiment, the gate of the power transistor 140 is controlled by AC input 110 after it is rectified. In a specific such embodiment, the power transistor 140 is ON when current flows from an input to an output of the power transistor 140, e.g., when the gate voltage is approximately 0.5 V larger than the output voltage. The source of the 0.5V is the AC signal rectified to DC.

Whether the device 112 is based on a thermal switch 114 or a power transistor 140, in an embodiment, the solar module 104 further includes a junction box or "J-box," and the device 112 (or 112A) configured to provide the closed or open circuit is housed in the J-box. In an embodiment, the solar module 104 further includes a capacitor 160 coupled in parallel with the solar cells 130 (capacitor 160 shown in both FIGS. 1A and 1B). In an embodiment, the capacitor 160 operates to block the DC signal from the solar cells 130 and only allows the AC signal from AC input 110 to pass through. In an embodiment, the solar module 104 further includes a bypass diode 150 (shown in FIG. 1B) coupled in parallel with the solar cells 130. The bypass diode 150 may be configured to electrically decouple the solar module 104 from a solar system. In an embodiment, all solar modules in a solar system each have their own associated device 112, as depicted in FIG. 1A.

Figure 2:
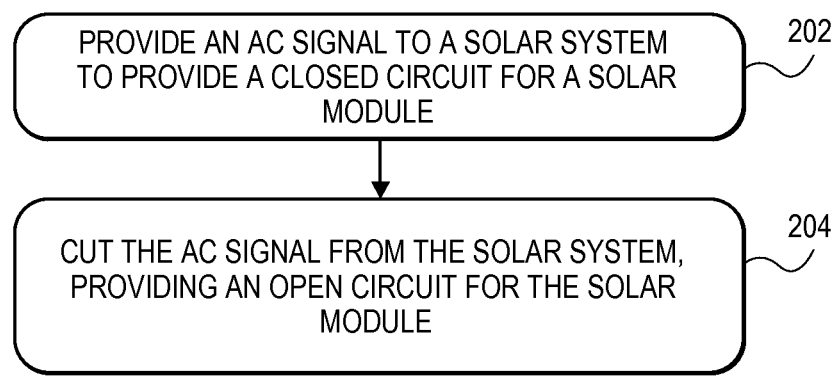
FIG. 2 is a flowchart representing operations in a method of electrically decoupling a solar module from a solar system, in accordance with an embodiment of the present invention.

FIG. 2 is a flowchart 200 representing operations in a method of electrically decoupling a solar module from a solar system, in accordance with an embodiment of the present invention.

Referring to operation 202 of flowchart 200, a method of electrically decoupling a solar module from a solar system includes providing an AC signal, e.g. from an energy grid, to the solar system to provide a closed circuit for the solar module. In an embodiment, providing the closed circuit includes using a closed configuration of a thermal switch coupled in series with the solar module. In another embodiment, the closed circuit is maintained by powering ON a power transistor coupled in series with the solar module.

Referring to operation 204, the method also includes cutting the AC signal from the solar system to provide an open circuit for the solar module. In an embodiment, providing the open circuit includes using an open configuration of the thermal switch. In another embodiment, providing the open circuit includes powering OFF the power transistor. In an embodiment, cutting the AC signal from the solar system includes powering OFF a residential main power supply in response to a fire, overheating, or other emergency event. In an embodiment, providing the open circuit for the solar module includes blocking, with a capacitor, a DC signal from the solar module to the solar system. In an embodiment, providing the open circuit for the solar module includes using a bypass diode coupled in parallel with the solar module.

It is to be understood that a measurement may be used to determine if the AC signal at an AC signal has in fact been cut. There are many ways to perform such a measurement or to make such a determination. For example, embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with a solar system. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 3:
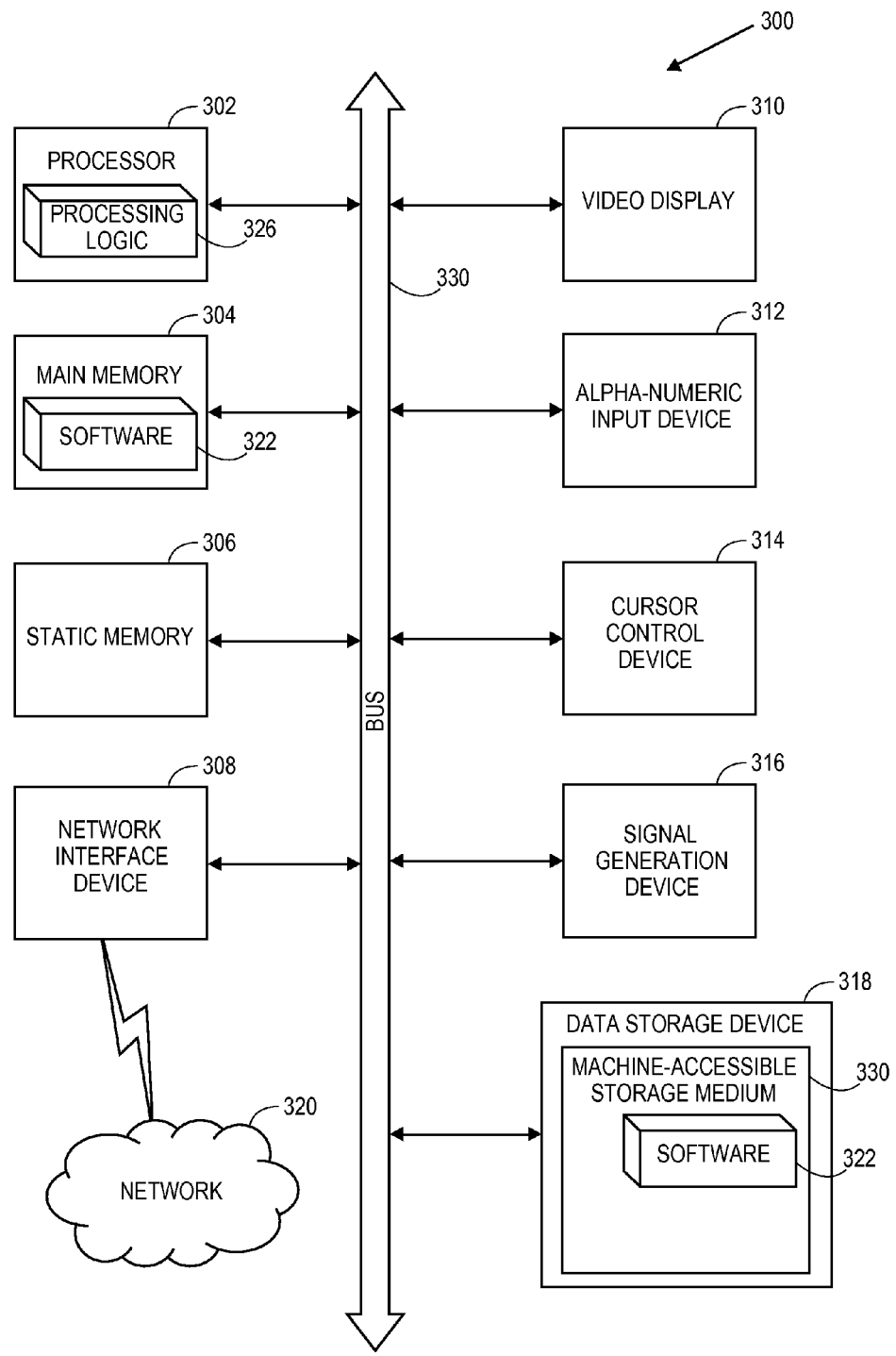
FIG. 3 illustrates a block diagram of an exemplary computer system, in accordance with an embodiment of the present invention.

FIG. 3 illustrates a diagrammatic representation of a machine in the exemplary form of a computer system 300 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 300 includes a processor 302, a main memory 304 (e.g., read-only memory (ROM), flash memory, dynamic random access memory (DRAM) such as synchronous DRAM (SDRAM) or Rambus DRAM (RDRAM), etc.), a static memory 306 (e.g., flash memory, static random access memory (SRAM), etc.), and a secondary memory 318 (e.g., a data storage device), which communicate with each other via a bus 330.

Processor 302 represents one or more general-purpose processing devices such as a microprocessor, central processing unit, or the like. More particularly, the processor 302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 302 may also be one or more special-purpose processing devices such as an application specific integrated circuit (ASIC), a field programmable gate array (FPGA), a digital signal processor (DSP), network processor, or the like. Processor 302 is configured to execute the processing logic 326 for performing the operations described herein.

The computer system 300 may further include a network interface device 308. The computer system 300 also may include a video display unit 310 (e.g., a liquid crystal display (LCD), a light emitting diode (LED) display, or a cathode ray tube (CRT)), an alphanumeric input device 312 (e.g., a keyboard), a cursor control device 314 (e.g., a mouse), and a signal generation device 316 (e.g., a speaker).

The secondary memory 318 may include a machine-accessible storage medium (or more specifically a computer-readable storage medium) 331 on which is stored one or more sets of instructions (e.g., software 322) embodying any one or more of the methodologies or functions described herein. The software 322 may also reside, completely or at least partially, within the main memory 304 and/or within the processor 302 during execution thereof by the computer system 300, the main memory 304 and the processor 302 also constituting machine-readable storage media. The software 322 may further be transmitted or received over a network 320 via the network interface device 308.

While the machine-accessible storage medium 331 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, devices and methods for electrically decoupling a solar module from a solar system have been disclosed. In accordance with an embodiment of the present invention, a solar system includes a string of a plurality of solar modules coupled with an inverter through a DC power line. An AC input is coupled with the DC power line. A device is also included and is configured to provide a closed circuit for one of the plurality of solar modules if an AC signal voltage from the AC input is present on the DC power line, and is configured to provide an open circuit for the one of the plurality of solar modules if no AC signal voltage from the AC input is present on the DC power line. In one embodiment, the device includes a thermal switch coupled in series with the one of the plurality of solar modules, the thermal switch configured to be closed if an AC signal voltage is present on the DC power line, and the thermal switch configured to be open if no AC signal voltage is present on the DC power line. In another embodiment, the device includes a power transistor coupled in series with the one of the plurality of solar modules, the power transistor configured to be ON if an AC signal voltage is present on the DC power line, and the power transistor configured to be OFF if no AC signal voltage is present on the DC power line.

What is claimed is:

1. A solar system, comprising: a string of a plurality of solar modules coupled with an inverter through a DC power line; an AC input coupled with the DC power line; and a device configured to provide a closed circuit for one of the plurality of solar modules if an AC signal voltage from the AC input is present on the DC power line, and configured to provide an open circuit for the one of the plurality of solar modules if no AC signal voltage from the AC input is present on the DC power line;
  wherein the device comprises a power transistor coupled in series with the one of the plurality of solar modules, the power transistor configured to be ON if an AC signal voltage is present on the DC power line, and the power transistor configured to be OFF if no AC signal voltage is present on the DC power line;
  wherein the device further comprises a reservoir capacitor coupled directly to a base of the power transistor and a output of the power transistor, and a half wave rectifier directly coupled to the reservoir capacitor, the half wave rectifier comprising a diode and a resistor.

2. The solar system of claim 1, wherein the one of the plurality of solar modules comprises a capacitor coupled in parallel with solar cells of the one of the plurality of solar modules, the capacitor to block a DC signal of the DC power line from the device.

3. The solar system of claim 1, wherein the AC input is coupled with the DC power line by a transformer.

4. The solar system of claim 3, wherein the transformer is driven by a main AC power supply coupled with an energy grid.

5. The solar system of claim 4, wherein the device is configured to provide an open circuit for the one of the plurality of solar modules in response to an event during which the main AC power supply is disconnected from the energy grid.

6. The solar system of claim 1, wherein each of the plurality of solar modules comprises a device configured to provide a closed circuit for each of the plurality of solar modules, respectively, if an AC signal voltage is present on the DC power line, and configured to provide an open circuit for each of the plurality of solar modules, respectively, if no AC signal voltage is present on the DC power line.

7. The solar system of claim 1, wherein the one of the plurality of solar modules comprises a junction box, and wherein the device is housed in the junction box.

8. A solar module, comprising: one or more solar cells configured to provide a DC signal to a solar system; and a device coupled in series with the solar cells, the device configured to provide a closed circuit for the solar module in response to a received AC signal, and configured to provide an open circuit for the solar module if no AC signal is received;
  wherein the device comprises a power transistor, the power transistor configured to be ON if an AC signal is received, and the power transistor configured to be OFF if no AC signal is received;
  wherein the device further comprises a reservoir capacitor coupled directly to a base of the power transistor and a output of the power transistor, and a half wave rectifier directly coupled to the reservoir capacitor, the half wave rectifier comprising a diode and a resistor.

9. The solar module of claim 8, further comprising: a junction box, wherein the device configured to provide the closed or open circuit is housed in the junction box.

10. The solar module of claim 8, further comprising: a capacitor coupled in parallel with the solar cells, the capacitor to block the DC signal from the device.

11. A method of electrically decoupling a solar module from a solar system, the method comprising: providing an AC signal from an energy grid to the solar system to provide a closed circuit for the solar module; and cutting the AC signal from the solar system, the cutting providing an open circuit for the solar module;
  wherein providing the closed circuit comprises powering ON a device comprising a power transistor, and providing the open circuit comprises powering OFF the power transistor;
  wherein the device further comprises a reservoir capacitor coupled directly to a base of the power transistor and a output of the power transistor, and a half wave rectifier directly coupled to the reservoir capacitor, the half wave rectifier comprising a diode and a resistor.

12. The method of claim 11, wherein cutting the AC signal from the solar system comprises powering OFF a main power supply in response to an emergency event.

* * * * *